United States Patent
Bae et al.

(10) Patent No.: US 8,697,338 B2
(45) Date of Patent: Apr. 15, 2014

(54) PHOTOLITHOGRAPHIC METHODS

(75) Inventors: Young Cheol Bae, Weston, MA (US); Rosemary Bell, Wayland, MA (US); Jong Keun Park, Hudson, MA (US); Seung-Hyun Lee, Marlborough, MA (US)

(73) Assignee: Rohm and Haas Electronics Materials LLC, Marlborough, MA (US)

( * ) Notice: Subject to any disclaimer, the term of this patent is extended or adjusted under 35 U.S.C. 154(b) by 0 days.

(21) Appl. No.: 13/607,729

(22) Filed: Sep. 9, 2012

(65) Prior Publication Data

US 2013/0244438 A1    Sep. 19, 2013

Related U.S. Application Data

(60) Provisional application No. 61/533,106, filed on Sep. 9, 2011.

(51) Int. Cl.
  *G03F 7/26*    (2006.01)

(52) U.S. Cl.
  USPC ......................................................... 430/311

(58) Field of Classification Search
  USPC .......................................... 430/322, 331, 311
  See application file for complete search history.

(56) References Cited

U.S. PATENT DOCUMENTS

| | | | |
|---|---|---|---|
| 6,764,806 B2 | 7/2004 | Jung et al. | |
| 8,241,832 B2 | 8/2012 | Wang et al. | |
| 2005/0250898 A1* | 11/2005 | Maeda et al. | 524/544 |
| 2008/0102405 A1 | 5/2008 | Watanabe et al. | |
| 2009/0280431 A1* | 11/2009 | Hirano et al. | 430/270.1 |
| 2011/0020755 A1 | 1/2011 | Tsubaki | |
| 2011/0159253 A1* | 6/2011 | Kang et al. | 428/195.1 |
| 2012/0219755 A1* | 8/2012 | Bae et al. | 428/141 |

* cited by examiner

*Primary Examiner* — Kathleen Duda
*Assistant Examiner* — Caleen Sullivan
(74) *Attorney, Agent, or Firm* — Jonathan D. Baskin

(57) ABSTRACT

Provided are photoresist overcoat compositions, substrates coated with the overcoat compositions and methods of forming electronic devices by a negative tone development process. The compositions, coated substrates and methods find particular applicability in the manufacture of semiconductor devices.

11 Claims, 1 Drawing Sheet

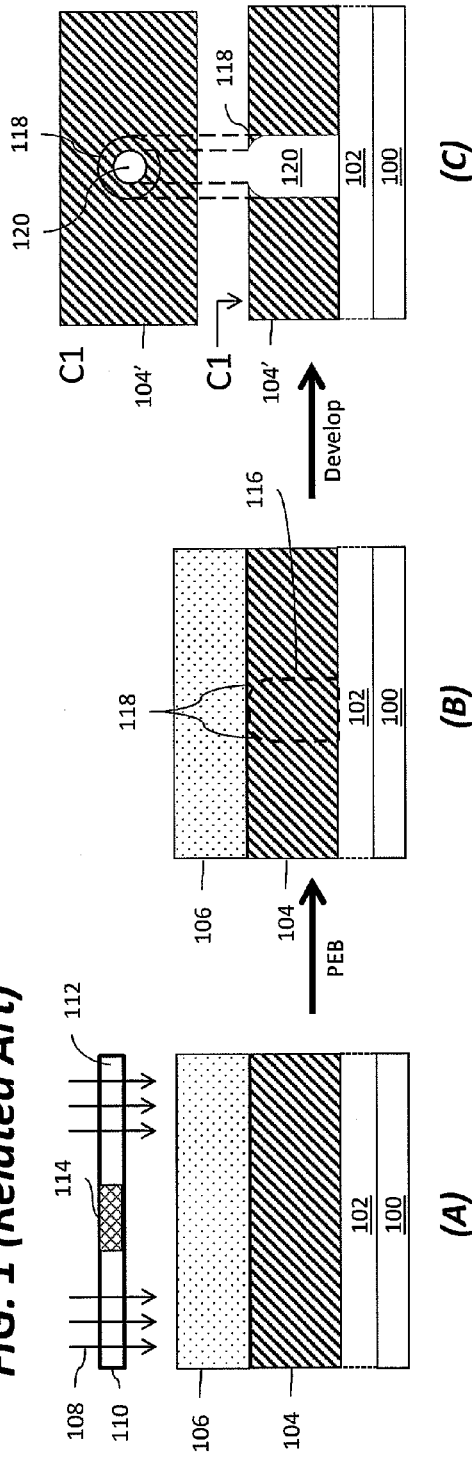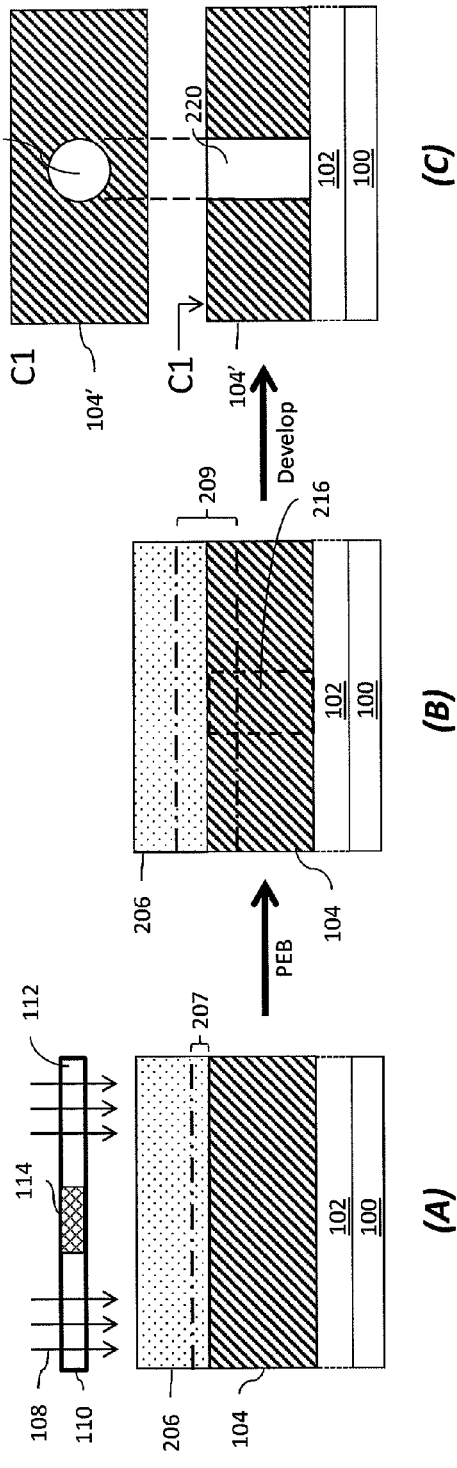

PHOTOLITHOGRAPHIC METHODS

This application claims the benefit of priority under 35 U.S.C. §119(e) to U.S. Provisional Application No. 61/533,106, filed Sep. 9, 2011, the entire contents of which are incorporated herein by reference.

The invention relates generally to the manufacture of electronic devices. More specifically, this invention relates to photolithographic methods which allow for the formation of fine patterns using a negative tone development process.

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a resin having acid-labile leaving groups and a photoacid generator. Exposure to actinic radiation causes the acid generator to form an acid which, during post-exposure baking, causes cleavage of the acid-labile groups in the resin. This creates a difference in solubility characteristics between exposed and unexposed regions of the resist in an aqueous alkaline developer solution. Exposed regions of the resist are soluble in the aqueous alkaline developer and are removed from the substrate surface, whereas unexposed regions, which are insoluble in the developer, remain after development to form a positive image.

One approach to achieving nm-scale feature sizes in semiconductor devices is the use of short wavelengths of light, for example, 193 nm or less, during exposure of chemically amplified photoresists. To further improve lithographic performance, immersion lithography tools have been developed to effectively increase the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium. When using water as the immersion fluid, the maximum numerical aperture can be increased, for example, from 1.2 to 1.35. With such an increase in numerical aperture, it is possible to achieve a 40 nm half-pitch resolution in a single exposure process, thus allowing for improved design shrink. This standard immersion lithography process, however, is generally not suitable for manufacture of devices requiring greater resolution, for example, for the 32 nm and 22 nm half-pitch nodes.

Considerable effort has been made to extend the practical resolution beyond that achieved with positive tone development from both a materials and processing standpoint. One such example involves negative tone development (NTD) of a traditionally positive-type chemically amplified photoresist. The NTD process allows for improved resolution and process window as compared with standard positive tone imaging by making use of the superior imaging quality obtained with bright field masks for printing critical dark field layers. NTD resists typically employ a resin having acid-labile (or acid-cleavable) groups and a photoacid generator. Exposure to actinic radiation causes the photoacid generator to form an acid which, during post-exposure baking, causes cleavage of the acid-labile groups giving rise to a polarity switch in the exposed regions. As a result, a difference in solubility characteristics is created between exposed and unexposed regions of the resist such that unexposed regions of the resist can be removed by organic developers such as ketones, esters or ethers, leaving behind a pattern created by the insoluble exposed regions.

The use in immersion lithography of a protective barrier material between the photoresist and immersion fluid to avoid leaching of photoresist components and fouling of the exposure tool optics, as well as providing antireflective properties, is known. The barrier layer can be formed from components added to the photoresist composition which self-segregate to the resist layer upper surface during the spin-coating process. Alternatively, a composition separate from the photoresist can be used to form an overcoat or topcoat layer over the photoresist layer. U.S. Patent Application Pub. No. US2011/0020755A1 discloses an NTD method which involves formation of a protective film on a resist film before exposing the resist film, exposing the resist film via an immersion medium and performing development with a negative developer. The protective film composition contains a solvent for even application of the protective film to the top of the resist film without dissolving the resist film, a resin having no aromatic groups having transparency to 193 nm light and optionally a surfactant.

It has been observed by the inventors that "necking" of contact holes or "T-topping" in line and trench patterns can occur in the developed resist patterns resulting from the NTD process. This effect is illustrated in FIG. 1 in the case of contact hole pattern formation. A substrate 100 coated with one or more layers to be patterned 102, a photoresist layer 104 and an immersion topcoat layer 106. The photoresist layer is exposed to activating radiation 108 through a photomask 110 to create a difference in solubility between exposed and unexposed regions as shown in FIG. 1A. The photomask has optically transparent and optically opaque regions 112, 114 corresponding to regions of the resist layer to remain and be removed, respectively, in a subsequent development step. Following post exposure bake (PEB), a latent image, defined by the boundary (dashed line 116) between polarity-switched and unswitched regions, is formed in the photoresist as shown in FIG. 1B. The polarity-switch undesirably extends into regions 118 at the resist surface which, during the exposure step, laid beneath the opaque mask pattern 114. This is believed to be a result of the diffusion of stray light beneath edges of the photomask opaque pattern. During development with an organic developer, the topcoat layer 106 and unexposed (unswitched) regions of the photoresist layer 104 are removed to form contact hole pattern 120, as shown in FIG. 1C. The resulting pattern exhibits necking at the resist layer upper surface where the polarity-switched resist regions 118 are not removed. The occurrence of "necking" or "T-topping" generally results in a poor process window such as depth of focus and exposure latitude. These problems can lead, for example, to random missing contact holes or to micro-bridging defects in the case of narrow trench or line pattern formation, thereby adversely impacting device yield. The aforementioned US2011/0020755A1 document does not recognize the problem of T-topping or necking in formed resist patterns or a solution thereto.

There is a continuing need in the art for improved photolithographic methods for negative tone development which allow for the formation of fine patterns in electronic device fabrication and which avoid or conspicuously ameliorate one or more of the foregoing problems associated with the state of the art. In accordance with an aspect of the invention, methods of forming electronic devices are provided. The methods comprise: (a) providing a semiconductor substrate comprising one or more layers to be patterned; (b) forming a photoresist layer over the one or more layers to be patterned; (c) coating a photoresist overcoat composition over the photoresist layer, wherein the overcoat composition comprises a basic quencher, a polymer and an organic solvent; (d) exposing the layer to actinic radiation; and (e) developing the exposed film with an organic solvent developer.

Also provided are electronic devices formed by the methods described herein.

As used herein: "g" means grams; wt % means weight percent; "L" means liter; "mL" means milliliter; "nm" means nanometer; "mm" means millimeter; "min" means minute; "h" means hour; "Å" means Angstrom; "mol %" means mole percent; "Mw" means weight average molecular weight; and "Mn" means number average molecular weight; "PDI" means polydispersity index=Mw/Mn; "copolymer" is inclusive of polymers containing two or more different types of polymerized units; "alkyl" is inclusive of linear, branched and cyclic alkyl structures; "aliphatic" is inclusive of linear, branched and cyclic aliphatic structures; and the articles "a" and "an" are inclusive of one or more.

The present invention will be described with reference to the following drawings, in which like reference numerals denote like features, and in which:

FIG. 1A-C illustrates a contact hole formation process according to the related art; and FIG. 2A-C illustrates a process flow for forming a photolithographic pattern in accordance with the invention.

PHOTORESIST OVERCOAT COMPOSITIONS

The compositions useful in the invention when coated over a photoresist layer in a negative tone development process can provide various benefits, such as one or more of geometrically uniform resist patterns, reduced reflectivity during resist exposure, improved focus latitude, improved exposure latitude and reduced defectivity. These benefits can be achieved when using the compositions in dry lithography or immersion lithography processes. When used in immersion lithography, the overcoat compositions can be used to form an effective barrier layer for avoidance of leaching of photoresist components into the immersion fluid and to provide desirable contact angle characteristics with the immersion fluid to allow for increased exposure scan speeds.

The photoresist overcoat compositions include a basic quencher, a polymer, an organic solvent and can include additional optional components. The overcoat compositions include a polymer which imparts to layers formed from the compositions beneficial barrier properties to minimize or prevent migration of photoresist components into the immersion fluid, and beneficial contact angle characteristics to provide for a high immersion fluid receding contact angle at the overcoat/immersion fluid interface, thereby allowing for faster exposure tool scanning speeds. A layer of the overcoat composition in a dried state typically has a water receding contact angle of from 70° to 85°, preferably from 75 to 80°. The phrase "in a dried state" means containing 8 wt % or less of solvent, based on the entire composition.

The polymer should have very good developability before and after photolithographic treatment. To minimize residue defects originated from the overcoat materials, the dissolution rate of a dried layer of the overcoat composition should be greater than that of the underlying photoresist layer in the developer used in the patterning process. The polymer typically exhibits a developer dissolution rate of 100 Å/second or higher, preferably 1000 Å/second or higher. The polymer can be free of silicon and fluorine. The polymer is soluble in the organic solvent of the overcoat composition, described herein, and is soluble in organic developers used in negative tone development processes. The polymer preferably has a low surface energy relative to the basic quencher described below.

The polymer is preferably formed from a monomer having the following general formula (I):

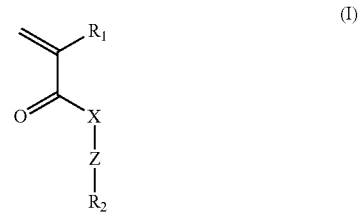

wherein: $R_1$ is chosen from hydrogen and substituted or unsubstituted C1 to C3 alkyl, preferably hydrogen or methyl; $R_2$ is chosen from substituted and unsubstituted C1 to C15 alkyl, preferably C4 to C8 alkyl, more preferably C4 to C6 alkyl, the substituted alkyls including, for example, haloalkyl and haloalcohol such as fluoroalkyl and fluoroalcohol, and is preferably branched to provide higher receding contact angles; X is oxygen, sulfur or is represented by the formula $NR_3$, wherein $R_3$ is chosen from hydrogen and substituted and unsubstituted C1 to C10 alkyl, preferably C1 to C5 alkyl; and Z is a single bond or a spacer unit chosen from substituted and unsubstituted aliphatic (such as C1 to C6 alkylene) and aromatic hydrocarbons, and combinations thereof, optionally with one or more linking moiety chosen from —O—, —S—, —COO— and —CONR$_4$— wherein $R_4$ is chosen from hydrogen and substituted and unsubstituted C1 to C10 alkyl, preferably C2 to C6, alkyl.

Exemplary suitable monomers of general formula (I) are described below, but are not limited to these structures. For purposes of these structures, "$R_1$" and "X" are as defined above.

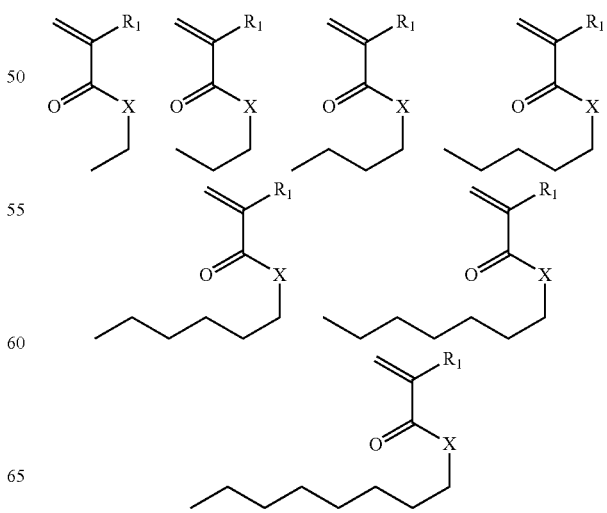

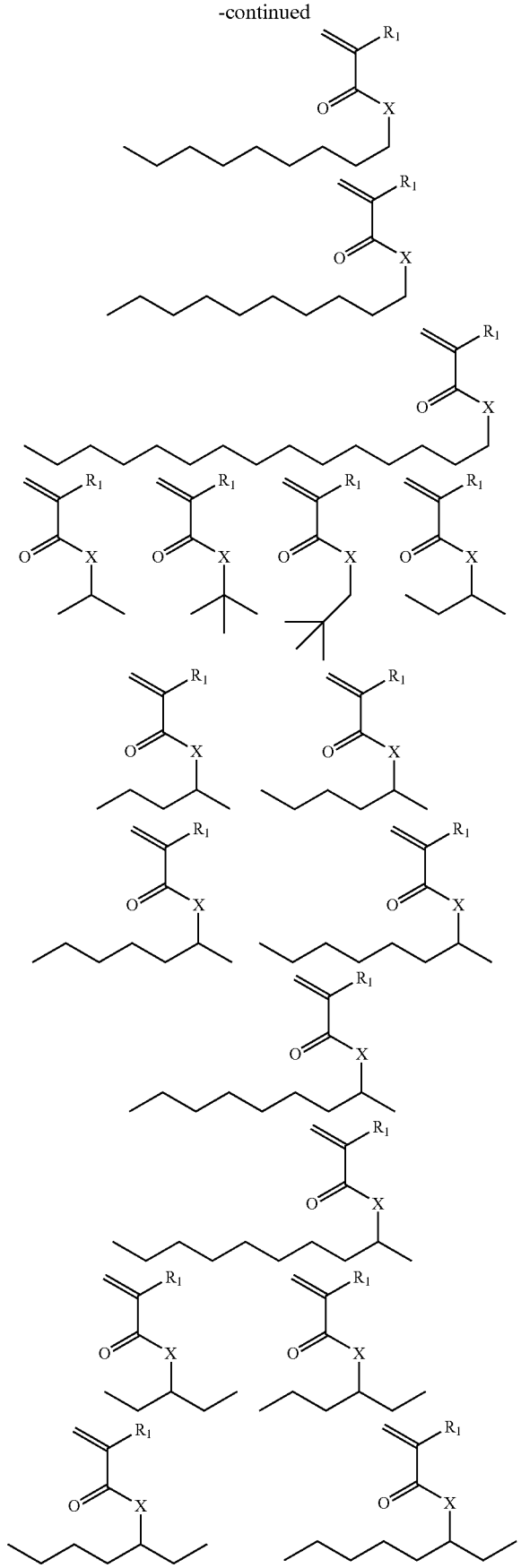
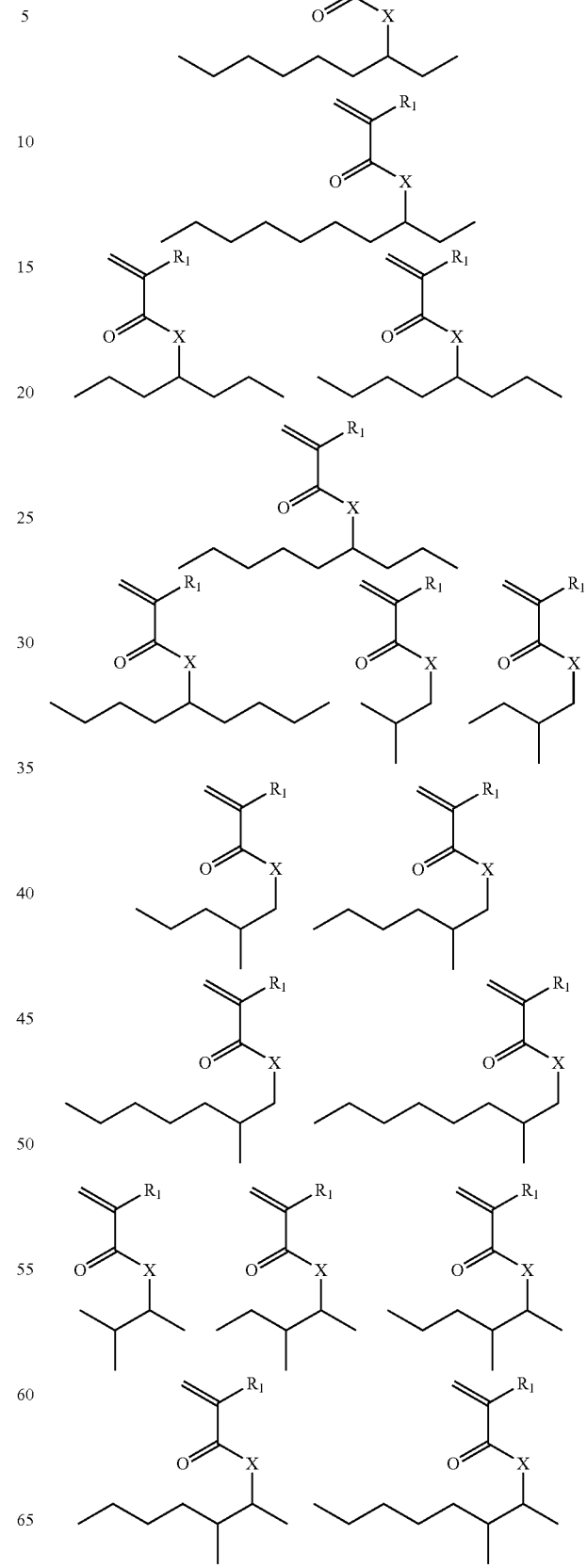

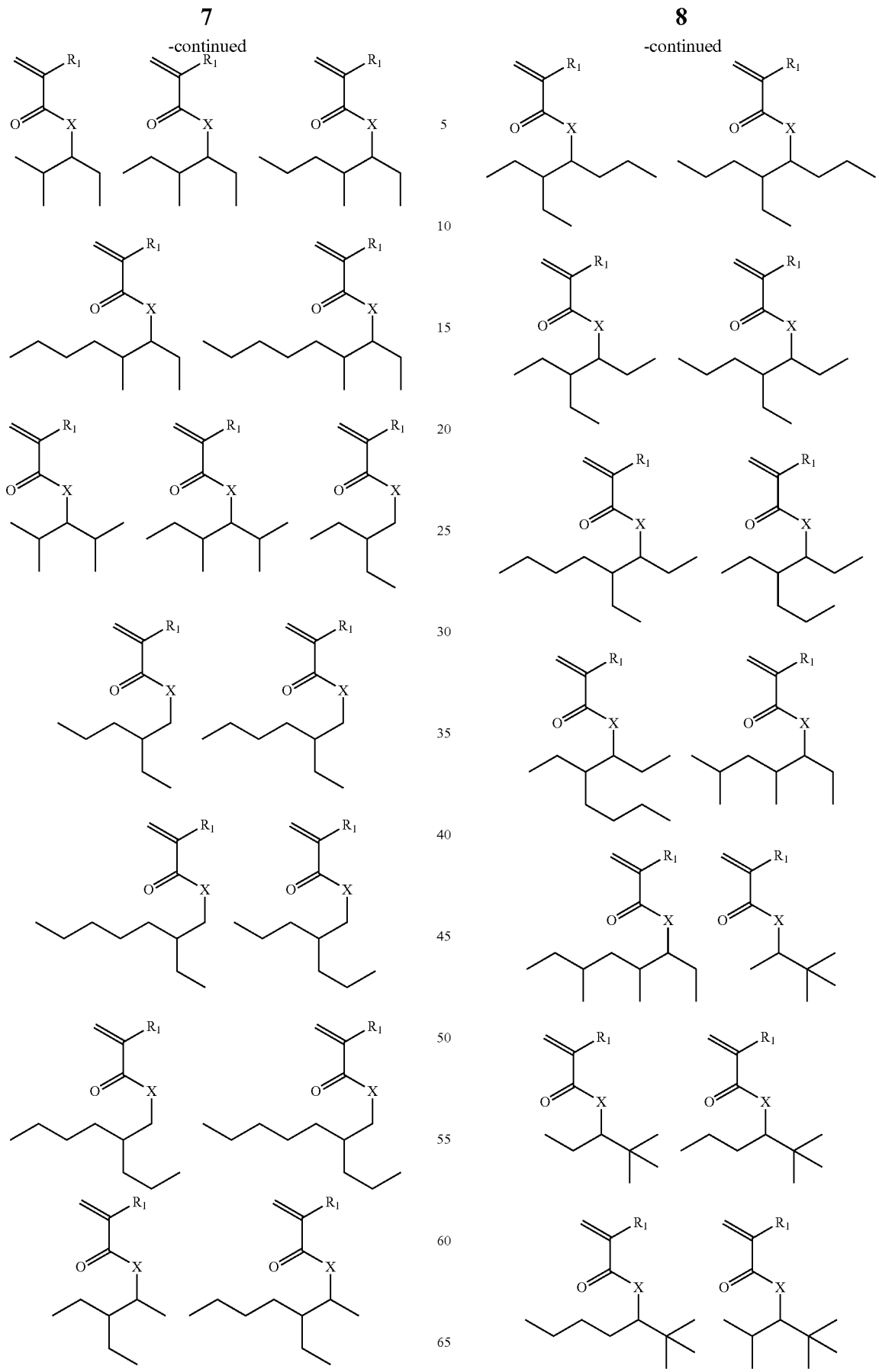

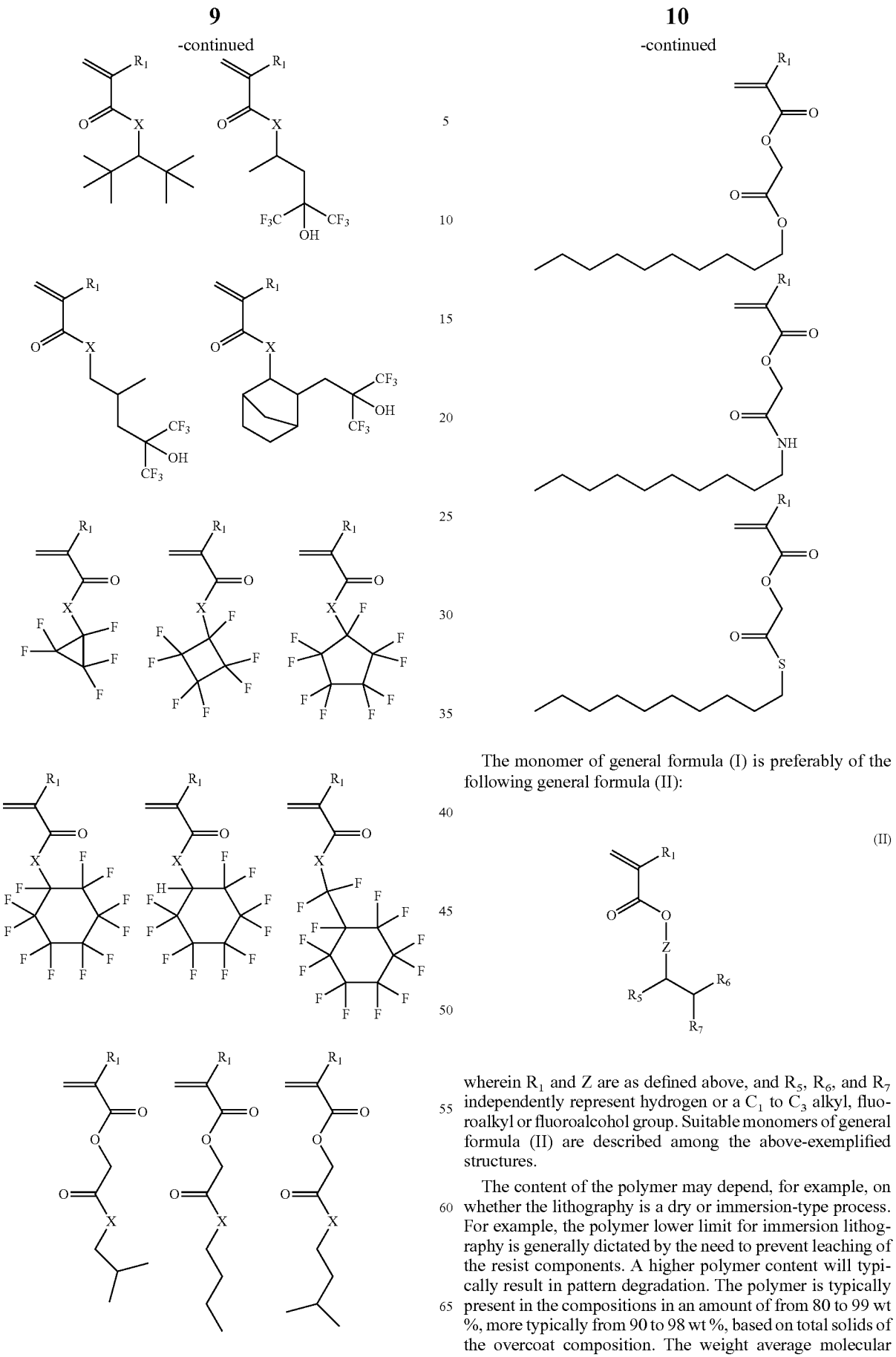

The monomer of general formula (I) is preferably of the following general formula (II):

wherein $R_1$ and Z are as defined above, and $R_5$, $R_6$, and $R_7$ independently represent hydrogen or a $C_1$ to $C_3$ alkyl, fluoroalkyl or fluoroalcohol group. Suitable monomers of general formula (II) are described among the above-exemplified structures.

The content of the polymer may depend, for example, on whether the lithography is a dry or immersion-type process. For example, the polymer lower limit for immersion lithography is generally dictated by the need to prevent leaching of the resist components. A higher polymer content will typically result in pattern degradation. The polymer is typically present in the compositions in an amount of from 80 to 99 wt %, more typically from 90 to 98 wt %, based on total solids of the overcoat composition. The weight average molecular weight of the polymer is typically less than 400,000, preferably from 5000 to 50,000, more preferably from 5000 to 25,000.

Polymers useful in the overcoat compositions can be homopolymers formed from the monomers of general formula (I) or can be copolymers having a plurality of distinct repeat units, for example, two, three or four distinct repeat units. The distinct units can, for example, include polymerized units of different monomers of general formula (I). Exemplary copolymers useful in the overcoat compositions as the polymer include the following copolymers:

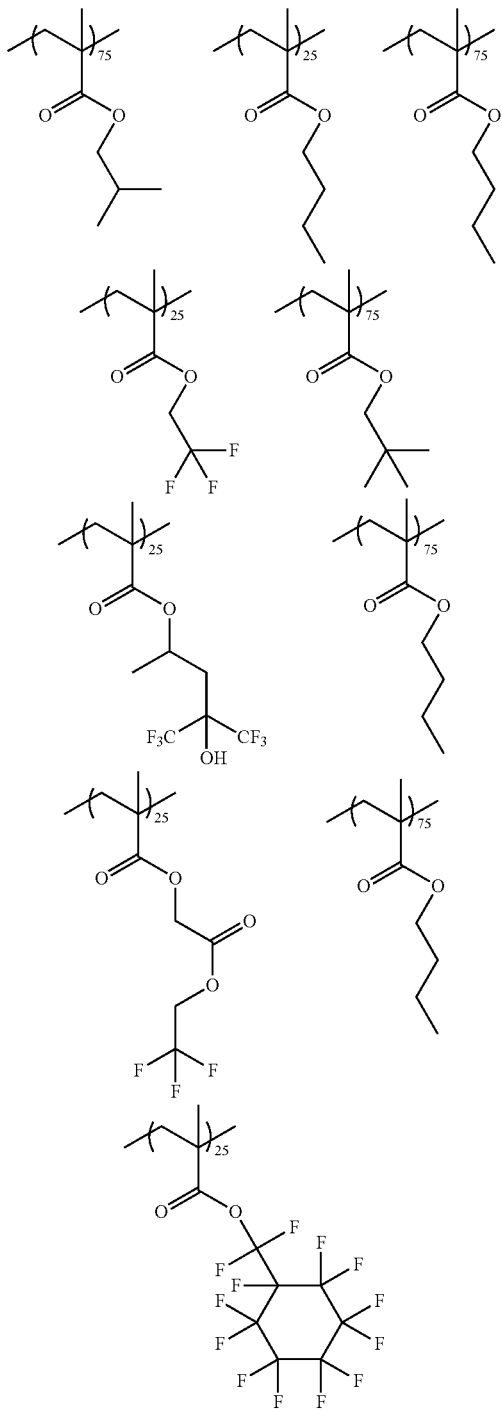

The overcoat compositions typically include a single polymer, but can optionally include one or more additional polymer of general formula (I) or other polymer. Suitable polymers and monomers for use in the overcoat compositions are commercially available and/or can readily be made by persons skilled in the art.

The overcoat compositions further include an organic solvent or mixture of organic solvents. Suitable solvent materials to formulate and cast the overcoat composition exhibit excellent solubility characteristics with respect to the non-solvent components of the overcoat composition, but do not appreciably dissolve an underlying photoresist layer. Suitable organic solvents for the overcoat composition include, for example: alkyl esters such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; and alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; and mixtures containing one or more of these solvents. Of these organic solvents, alkyl propionates, alkyl butyrates and ketones, preferably branched ketones, are preferred and, more preferably, $C_8$-$C_9$ alkyl propionates, $C_8$-$C_9$ alkyl propionates, $C_8$-$C_9$ ketones, and mixtures containing one or more of these solvents. Suitable mixed solvents include, for example, mixtures of an alkyl ketone and an alkyl propionate such as the alkyl ketones and alkyl propionates described above. The solvent component of the overcoat composition is typically present in an amount of from 90 to 99 wt % based on the overcoat composition.

The photoresist overcoat compositions further include a basic quencher. The basic quencher is present for purposes of neutralizing acid generated in the surface region of the underlying photoresist layer by stray light which reaches what are intended to be unexposed (dark) regions of the photoresist layer. This allows for improvement in depth of focus in the defocus area and exposure latitude by controlling unwanted deprotection reaction in the unexposed areas. As a result, irregularities in the profile, for example, necking and T-topping, in formed resist patterns can be minimized or avoided.

To allow for effective interaction between the basic quencher and the acid generated in the dark areas of the underlying photoresist layer, the basic quencher should be of a non-surfactant-type. That is, the basic quencher should not be of a type that migrates to the top surface of the overcoat layer due, for example, to a low surface free energy relative to other components of the overcoat composition. In such a case, the basic quencher would not be appreciably present at the photoresist layer interface for interaction with the generated acid to prevent acid deprotection. The basic quencher should therefore be of a type that is present at the overcoat layer/photoresist layer interface, whether being uniformly dispersed through the overcoat layer or forming a graded or segregated layer at the interface. Such a segregated layer can be achieved by selection of a basic quencher having a high surface free energy relative to other components of the overcoat composition.

Suitable basic quenchers include, for example: linear and cyclic amides and derivatives thereof such as N,N-bis(2-hydroxyethyl)pivalamide, N,N-Diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl)amine, 2,2',2'',2'''-(ethane-1,2-diylbis(azanetriyl))tetraethanol, and 2-(dibutylamino)ethanol, 2,2',2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl)morpholine. Of these basic quenchers, 1-(tert-butoxycarbonyl)-4-hydroxypiperidine and triisopropanolamine are preferred. While the content of the basic quencher will depend, for example, on the content of the photoacid generator in the underlying photoresist layer, it is typically present in an amount of from 0.1 to 5 wt %, preferably from 0.5 to 3 wt %, more preferably from 1 to 3 wt %, based on total solids of the overcoat composition.

The photoresist overcoat compositions can include one or more optional materials. For example, the compositions can include one or more of actinic and contrast dyes, anti-striation agents, and the like. Of these, actinic and contrast dyes are preferred for enhancing antireflective properties of layers formed from the compositions. Such optional additives if used are typically present in the composition in minor amounts such as from 0.1 to 10 wt % based on total solids of the overcoat composition. The overcoat compositions are preferably free of acid generator compounds, for example, thermal acid generator compounds and photoacid generator compounds, as such compounds may neutralize the effect of the basic quencher in the overcoat compositions.

The photoresist overcoat compositions can be prepared following known procedures. For example, the compositions can be prepared by dissolving solid components of the composition in the solvent components. The desired total solids content of the compositions will depend on factors such as the particular polymer(s) in the composition and desired final layer thickness. Preferably, the solids content of the overcoat compositions is from 1 to 10 wt %, more preferably from 1 to 5 wt %, based on the total weight of the composition.

Resist overcoat layers formed from the compositions typically have an index of refraction of 1.4 or greater at 193 nm, preferably 1.47 or greater at 193 nm The index of refraction can be tuned by changing the composition of the polymer(s) or other components of the overcoat composition. For example, increasing the relative amount of organic content in the overcoat composition may provide increased refractive index of the layer. Preferred overcoat composition layers will have a refractive index between that of the immersion fluid and the photoresist at the target exposure wavelength.

Reflectivity of the overcoat layer can be reduced if the refractive index of the overcoat layer ($n_1$) is the geometric mean of that of the materials on either side ($n_1=\sqrt{(n_0\ n_2)}$), where $n_0$ is the refractive index of water in the case of immersion lithography or air for dry lithography, and $n_2$ is the refractive index of the photoresist. Also to enhance antireflective properties of layers formed from the overcoat compositions, it is preferred that the thickness of the overcoat ($d_1$) is chosen such that the wavelength in the overcoat is one quarter the wavelength of the incoming wave ($\lambda_0$). For a quarter wavelength antireflective coating of an overcoat composition with a refractive index $n_1$, the thickness $d_1$ that gives minimum reflection is calculated by $d_1=\lambda_0/(4\ n_1)$.

Photoresist Compositions

Photoresist compositions useful in the invention include chemically-amplified photoresist compositions comprising a matrix polymer that is acid-sensitive, meaning that as part of a layer of the photoresist composition, the polymer and composition layer undergo a change in solubility in an organic developer as a result of reaction with acid generated by a photoacid generator following softbake, exposure to activating radiation and post exposure bake. The change in solubility is brought about when acid-labile groups such as photoacid-labile ester or acetal groups in the matrix polymer undergo a photoacid-promoted deprotection reaction on exposure to activating radiation and heat treatment. Suitable photoresist compositions useful for the invention are commercially available For imaging at sub-200 nm wavelengths such as 193 nm, the matrix polymer is typically substantially free (e.g., less than 15 mole %) of phenyl, benzyl or other aromatic groups where such groups are highly absorbing of the radiation. Suitable polymers that are substantially or completely free of aromatic groups are disclosed in European application EP930542A1 and U.S. Pat. Nos. 6,692,888 and 6,680,159, all of the Shipley Company. Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer.

Suitable matrix polymers further include polymers that contain (alkyl)acrylate units, preferably including acid-labile (alkyl)acrylate units, such as t-butyl acrylate, t-butyl methacrylate, methyladamantyl acrylate, methyl adamantyl methacrylate, ethylfenchyl acrylate, ethylfenchyl methacrylate, and the like, and other non-cyclic alkyl and alicyclic(alkyl) acrylates. Such polymers have been described, for example, in U.S. Pat. No. 6,057,083, European Published Applications EP01008913A1 and EP00930542A1, and U.S. Pat. No. 6,136,501.

Other suitable matrix polymers include, for example, those which contain polymerized units of a non-aromatic cyclic olefin (endocyclic double bond) such as an optionally substituted norbornene, for example, polymers described in U.S. Pat. Nos. 5,843,624 and 6, 048,664.

Still other suitable matrix polymers include polymers that contain polymerized anhydride units, particularly polymerized maleic anhydride and/or itaconic anhydride units, such as disclosed in European Published Application EP01008913A1 and U.S. Pat. No. 6,048,662.

Also suitable as the matrix polymer is a resin that contains repeat units that contain a hetero atom, particularly oxygen and/or sulfur (but other than an anhydride, i.e., the unit does not contain a keto ring atom). The heteroalicyclic unit can be fused to the polymer backbone, and can comprise a fused carbon alicyclic unit such as provided by polymerization of a norbornene group and/or an anhydride unit such as provided by polymerization of a maleic anhydride or itaconic anhydride. Such polymers are disclosed in PCT/US01/14914 and U.S. Pat. No. 6,306,554. Other suitable hetero-atom group containing matrix polymers include polymers that contain polymerized carbocyclic aryl units substituted with one or more hetero-atom (e.g., oxygen or sulfur) containing groups, for example, hydroxy naphthyl groups, such as disclosed in U.S. Pat. No. 7,244,542.

Blends of two or more of the above-described matrix polymers can suitably be used in the photoresist compositions.

Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000.

The photosensitive composition further comprises a photoactive component such as a a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can further include other optional materials. For example, negative-acting resist compositions typically also include a crosslinker component. Suitable crosslinker components include, for example, an amine-based material such as a melamine resin, that will cure, crosslink or harden upon exposure to acid on exposure of a photoacid generator to activating radiation. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125. For imaging at sub-200 nm wavelengths such as 193 nm, preferred negative-acting photoresists are disclosed in WO 03077029 to the Shipley Company.

The photoresist compositions can also include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases are described above with respect to the basic quencher in the overcoat composition. The added base is suitably used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Negative Tone Development Methods

Processes in accordance with the invention will now be described with reference to FIG. 2A-C, which illustrates an exemplary process flow for forming a photolithographic pattern by negative tone development.

FIG. 2A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer and/or a bottom antireflective coating (BARC) over which a photoresist layer 104 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™40A and AR™124 antireflectant materials.

A photoresist layer 104 formed from a composition such as described herein is disposed on the substrate over the antireflective layer (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 104 is from about 500 to 3000 Å.

The photoresist layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

A photoresist overcoat layer 206 formed from an overcoat composition as described herein is formed over the photoresist layer 104. The overcoat composition is typically applied to the substrate by spin-coating. The solids content of the coating solution can be adjusted to provide a desired film thickness based upon the specific coating equipment utilized, the viscosity of the solution, the speed of the coating tool and the amount of time allowed for spinning. To reduce reflectivity of the overcoat layer, the thickness is preferably chosen such that the wavelength in the overcoat is one quarter the wavelength of the incoming wave. A typical thickness for the photoresist overcoat layer 206 is from 200 to 1000 Å.

The photoresist overcoat layer can next be baked to remove minimize the solvent content in the layer. The bake can be conducted on a hotplate or in an oven, with a hotplate being typical. Typical bakes are conducted at a temperature of from about 80 to 120° C., and a time of from about 30 to 90 seconds. The basic quencher may be present in the overcoat layer 206 dispersed homogeneously through the overcoat layer, or may be present as a segregated or graded quencher region 207.

The photoresist layer 104 is next exposed to activating radiation 108 through a first photomask 110 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions 112, 114 corresponding to regions of the resist layer to remain and be removed, respectively, in a subsequent development step. The exposure wavelength is typically sub-400 nm, sub-300 nm or sub-200 nm, with 248 nm and 193 nm being typical. The methods find use in immersion or dry (non-immersion) lithography techniques. The exposure energy is typically from about 10 to 80 mJ/cm$^2$, dependent upon the exposure tool and the components of the photosensitive composition.

Following exposure of the photoresist layer 104, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. Following post exposure bake, it is believed that the basic quencher diffuses into the surface region of the photoresist layer 104 as shown by dashed lines 209. A latent image 216 defined by the boundary (dashed line) between polarity-switched and unswitched regions (corresponding to exposed and unexposed regions, respectively) is formed in the photoresist as shown in FIG. 2B. The diffused basic quencher in the photoresist is believed to prevent polarity switch in undesired dark regions of the photoresist layer, resulting in a latent image with vertical walls.

The overcoat layer 206 and exposed photoresist layer are next developed to remove unexposed regions of the photoresist layer 104, leaving exposed regions forming an open resist pattern 104' with contact hole pattern 220 having vertical sidewalls as shown in FIG. 2C. The developer is typically an organic developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Other suitable solvents include those used in the photoresist composition. The developer is preferably 2-heptanone or a butyl acetate such as n-butyl acetate.

Mixtures of organic solvents can preferably be employed as a developer, for example, a mixture of a first and second organic solvent. The first organic solvent can be chosen from hydroxy alkyl esters such as methyl-2-hydroxyisobutyrate and ethyl lactate; and linear or branched $C_5$ to $C_6$ alkoxy alkyl acetates such as propylene glycol monomethyl ether acetate (PGMEA). Of the first organic solvents, 2-heptanone and 5-methyl-2-hexanone are preferred. The second organic solvent can be chosen from linear or branched unsubstituted $C_6$ to $C_8$ alkyl esters such as n-butyl acetate, n-pentyl acetate, n-butyl propionate, n-hexyl acetate, n-butyl butyrate and isobutyl butyrate; and linear or branched $C_8$ to $C_9$ ketones such as 4-octanone, 2,5-dimethyl-4-hexanone and 2,6-dimethyl-4-heptanone. Of the second organic solvents, n-butyl acetate, n-butyl propionate and 2,6-dimethyl-4-heptanone are preferred. Preferred combinations of the first and second organic solvent include 2-heptanone/n-butyl propionate, cyclohexanone/n-butyl propionate, PGMEA/n-butyl propionate, 5-methyl-2-hexanone/n-butyl propionate, 2-heptanone/2,6-dimethyl-4-heptanone and 2-heptanone/n-butyl acetate. Of these, 2-heptanone/n-butyl acetate and 2-heptanone/n-butyl propionate are particularly preferred.

The organic solvents are typically present in the developer in a combined amount of from 90 wt % to 100 wt %, more typically greater than 95 wt %, greater than 98 wt %, greater than 99 wt % or 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove the unexposed regions of the photoresist, with a time of from 5 to 30 seconds being typical. Development is typically conducted at room temperature. The development process can be conducted without use of a cleaning rinse following development. In this regard, it has been found that the development process can result in a residue-free wafer surface rendering such extra rinse step unnecessary.

The BARC layer, if present, is selectively etched using resist pattern 104' as an etch mask, exposing the underlying hardmask layer. The hardmask layer is next selectively etched, again using the resist pattern 104' as an etch mask, resulting in patterned BARC and hardmask layers. Suitable etching techniques and chemistries for etching the BARC layer and hardmask layer are known in the art and will depend, for example, on the particular materials of these layers. Dry-etching processes such as reactive ion etching are typical. The resist pattern 104' and patterned BARC layer are next removed from the substrate using known techniques, for example, oxygen plasma ashing.

Using the hardmask pattern as an etch mask, the one or more layers 102 are selectively etched. Suitable etching techniques and chemistries for etching the underlying layers 102 are known in the art, with dry-etching processes such as reactive ion etching being typical. The patterned hardmask layer can next be removed from the substrate surface using known techniques, for example, a dry-etching process such as reactive ion etching. The resulting structure is a pattern of etched features. In an alternative exemplary method, it may be desirable to pattern the layers 102 directly using the resist pattern 104' without the use of a hardmask layer. Whether direct patterning is employed will depend on factors such as the materials involved, resist selectivity, resist pattern thickness and pattern dimensions.

The negative tone development methods of the invention are not limited to the exemplary methods described above. For example, the photoresist overcoat compositions can be used in a negative tone development double exposure method for making contact holes. An exemplary such process is a variation of the technique described with reference to FIG. 2, but using an additional exposure of the photoresist layer in a different pattern than the first exposure. In this process, the photoresist layer is exposed to actinic radiation through a photomask in a first exposure step. The photomask includes a series of parallel lines forming the opaque regions of the mask. Following the first exposure, a second exposure of the photoresist layer is conducted through a second photomask that includes a series of lines in a direction perpendicular to those of the first photomask. The resulting photoresist layer includes unexposed regions, once-exposed regions and twice-exposed regions. Following the second exposure, the photoresist layer is post-exposure baked and developed using a developer as described above. Unexposed regions corresponding to points of intersection of the lines of the two masks are removed, leaving behind the once- and twice-exposed regions of the resist. The resulting structure can next be patterned as described above with reference to FIG. 2.

Further refined resolution for features such as contact holes and trench patterns can be achieved using an NTD overexposure process. In this process, the photomask has large patterns relative to those to be printed on the wafer. Exposure conditions are selected such that light diffuses beneath the edge of the photomask pattern causing the polarity switch in the resist to extend beneath these edge regions.

EXAMPLES

Synthesis of Photoresist Polymers (PP)

The following monomers were employed in the synthesis of photoresist polymers (PP) used in the examples for photoresist compositions;

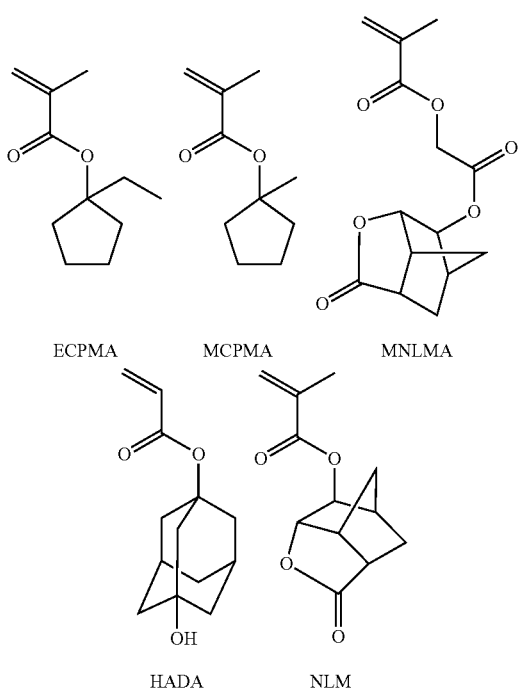

ECPMA  MCPMA  MNLMA

HADA  NLM

Synthesis of poly(ECPMA/MCPMA/MNLMA/HADA) (PP-1)

Monomers of ECPMA (5.092 g), MCPMA (10.967 g), MNLMA (15.661 g) and HADA (8.280 g) were dissolved in 60 g of propylene glycol monomethyl ether acetate (PG-MEA). The monomer solution was degassed by bubbling with nitrogen for 20 min. PGMEA (27.335 g) was charged into a 500 mL three-neck flask equipped with a condenser and a mechanical stirrer and was degassed by bubbling with nitrogen for 20 min. The solvent in the reaction flask was next brought to a temperature of 80° C. V601 (dimethyl-2,2-azo-diisobutyrate) (0.858 g) was dissolved in 8 g of PGMEA and the initiator solution was degassed by bubbling with nitrogen for 20 min. The initiator solution was added to the reaction flask and then monomer solution was fed into the reactor dropwise over a 3 hour period under rigorous stirring and nitrogen environment. After monomer feeding was complete, the polymerization mixture was left standing for one additional hour at 80° C. After 4 hours polymerization time (3 hours feeding and 1 hour post-feeding stirring), the polymerization mixture was allowed to cool to room temperature. Precipitation was carried out in methyl tert-butyl ether (MTBE) (1634 g). The powder precipitated was collected by filtration, air-dried overnight, re-dissolved in 120 g of tetrahydrofuran (THF), and re-precipitated into MTBE (1634 g). The final polymer was filtered, air-dried overnight and further dried under vacuum at 60° C. for 48 hours to give 31.0 g of poly(ECPMA/MCPMA/MNLMA/HADA) (15/35/30/20) copolymer (PP-1) (Mw=20,120 and Mw/Mn=1.59).

Synthesis of poly(MCPMA/NLM) (PP-2)

Monomers of MCPMA (17.234 g) and NLM (22.766 g) were dissolved in 60 g of PGMEA. The monomer solution was degassed by bubbling with nitrogen for 20 min. PGMEA (31.938 g) was charged into a 500 mL three-neck flask equipped with a condenser and a mechanical stirrer and was degassed by bubbling with nitrogen for 20 min. The solvent in the reaction flask was next brought to a temperature of 80° C. V601 (2.831 g) was dissolved in 8 g of PGMEA and the initiator solution was degassed by bubbling with nitrogen for 20 min. The initiator solution was added to the reaction flask and then monomer solution was fed into the reactor dropwise over a 3 hour period under rigorous stirring and nitrogen environment. After monomer feeding was complete, the polymerization mixture was left standing for one additional hour at 80° C. After 4 hours polymerization time (3 hours feeding and 1 hour post-feeding stirring), the polymerization mixture was allowed to cool to room temperature. Precipitation was carried out in MTBE (1713 g). The powder precipitated was collected by filtration, air-dried overnight, re-dissolved in 120 g of THF, and re-precipitated into MTBE (1713 g). The final polymer was filtered, air-dried overnight and further dried under vacuum at 60° C. for 48 hours to give 32 g of poly (MCPMA/NLM) (50/50) copolymer (PP-2) (Mw=8,060 and Mw/Mn=1.46).

Synthesis of Overcoat Polymers (OP)

The following monomers were employed in the synthesis of overcoat polymers (OP) used in formulating resist overcoat compositions;

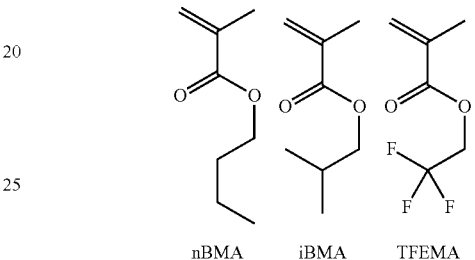

nBMA  iBMA  TFEMA

Synthesis of Poly(iBMA) (OP-1)

40 g of iso-butyl methacrylate (iBMA) monomers was dissolved in 60 g of PGMEA. The monomer solution was degassed by bubbling with nitrogen for 20 min. PGMEA (32.890 g) was charged into a 500 mL three-neck flask equipped with a condenser and a mechanical stirrer and was degassed by bubbling with nitrogen for 20 min. The solvent in the reaction flask was next brought to a temperature of 80° C. V601 (3.239 g) was dissolved in 8 g of PGMEA and the initiator solution was degassed by bubbling with nitrogen for 20 min. The initiator solution was added to the reaction flask and then monomer solution was fed into the reactor dropwise over a 3 hour period under rigorous stirring and nitrogen environment. After monomer feeding was complete, the polymerization mixture was left standing for one additional hour at 80° C. After 4 hours of polymerization time (3 hours feeding and 1 hour post-feeding stirring), the polymerization mixture was allowed to cool to room temperature. Precipitation was carried out in a methanol/water (8/2) mixture (1730 g). The precipitated polymer was collected by filtration, air-dried overnight, re-dissolved in 120 g of THF, and re-precipitated in a methanol/water (8/2) mixture (1730 g). The final polymer was filtered, air-dried overnight and further dried under vacuum at 25° C. for 48 hours to give 34.2 g of poly (iBMA) polymer (OP-1) (Mw=8,641 and Mw/Mn=1.61).

Synthesis of Poly(iBMA/nBMA) (75/25) (OP-2)

30 g of iBMA and 10 g of nBMA monomers were dissolved in 60 g of PGMEA. The monomer solution was degassed by bubbling with nitrogen for 20 min. PGMEA (32.890 g) was charged into a 500 mL three-neck flask equipped with a condenser and a mechanical stirrer and was degassed by bubbling with nitrogen for 20 min. The solvent in the reaction flask was next brought to a temperature of 80° C. V601 (3.239 g) was dissolved in 8 g of PGMEA and the initiator solution was degassed by bubbling with nitrogen for 20 min. The initiator solution was added into the reaction flask and then monomer solution was fed into the reactor dropwise over a 3 hour period under rigorous stirring and nitrogen environment. After monomer feeding was complete, the polymerization mixture was left standing for one additional hour at 80° C. After 4 hours of polymerization time (3 hours feeding and 1 hour post-feeding stirring), the polymerization mixture was allowed to cool to room temperature. Precipitation was carried out in a methanol/water (8/2) mixture (1730 g). The precipitated polymer was collected by filtration, air-dried overnight, re-dissolved in 120 g of THF, and re-precipitated into a methanol/water (8/2) mixture (1730 g). The final polymer was filtered, air-dried overnight and further dried under vacuum at 25° C. for 48 hours to give 33.1 g of poly(iBMA/nBMA) (75/25) copolymer (OP-2) (Mw=9,203 and Mw/Mn=1.60).

Synthesis of Poly(iBMA/nBMA) (50/50) (OP-3)

20 g of iBMA and 20 g of nBMA monomers were dissolved in 60 g of PGMEA. The monomer solution was degassed by bubbling with nitrogen for 20 min. PGMEA (32.890 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (3.239 g) was dissolved in 8 g of PGMEA and the initiator solution was degassed by bubbling with nitrogen for 20 min. The initiator solution was added into the reaction flask and then monomer solution was fed into the reactor dropwise over the 3 hours period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methanol/water (8/2) mixture (1730 g). The precipitated polymer was collected by filtration, air-dried overnight, re-dissolved in 120 g of THF, and re-precipitated into methanol/water (8/2) mixture (1730 g). The final polymer was filtered, air-dried overnight and further dried under vacuum at 25° C. for 48 hrs to give 32.5 g of poly(iBMA/nBMA) (50/50) copolymer (OP-3) (Mw=8,812 and Mw/Mn=1.60).

Synthesis of Poly(iBMA/nBMA) (25/75) (OP-4)

10 gram of iBMA and 30 gram of nBMA monomers were dissolved in 60 g of PGMEA. The monomer solution was degassed by bubbling with nitrogen for 20 min. PGMEA (32.890 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (3.239 g) was dissolved in 8 g of PGMEA and the initiator solution was degassed by bubbling with nitrogen for 20 min. The initiator solution was added into the reaction flask and then monomer solution was fed into the reactor dropwise over the 3 hours period under rigorous stirring and nitrogen environment. After monomer feeding was complete, the polymerization mixture was left standing for an additional hour at 80° C. After a total of 4 hours of polymerization time (3 hours of feeding and 1 hour of post-feeding stirring), the polymerization mixture was allowed to cool down to room temperature. Precipitation was carried out in methanol/water (8/2) mixture (1730 g). The precipitated polymer was collected by filtration, air-dried overnight, re-dissolved in 120 g of THF, and re-precipitated into methanol/water (8/2) mixture (1730 g). The final polymer was filtered, air-dried overnight and further dried under vacuum at 25° C. for 48 hrs to give 30.2 g of poly(iBMA/nBMA) (25/75) copolymer (OP-4) (Mw=9,654 and Mw/Mn=1.60).

Synthesis of Poly(nBMA) (OP-5)

40 g of nBMA monomer was dissolved in 60 g of PGMEA. The monomer solution was degassed by bubbling with nitrogen for 20 min. PGMEA (32.890 g) was charged into a 500 mL three-neck flask equipped with a condenser and a mechanical stirrer and was degassed by bubbling with nitrogen for 20 min. The solvent in the reaction flask was next brought to a temperature of 80° C. V601 (3.239 g) was dissolved in 8 g of PGMEA and the initiator solution was degassed by bubbling with nitrogen for 20 min. The initiator solution was added to the reaction flask and then monomer solution was fed into the reactor dropwise over the 3 hours period under rigorous stirring and nitrogen environment. After monomer feeding was complete, the polymerization mixture was left standing for one additional hour at 80° C. After 4 hrs of polymerization time (3 hours feeding and 1 hour post-feeding stifling), the polymerization mixture was allowed to cool to room temperature. Precipitation was carried out in a methanol/water (8/2) mixture (1730 g). The precipitated polymer was collected by filtration, air-dried overnight, re-dissolved in 120 g of THF, and re-precipitated into methanol/water (8/2) mixture (1730 g). The final polymer was filtered, air-dried overnight and further dried under vacuum at 25° C. for 48 hours to give 30.8 g of poly(nBMA) polymer (OP-5) (Mw=9,194 and Mw/Mn=1.60).

Synthesis of Poly(nBMA/TFEMA) (50/50) (OP-6)

13.747 g of nBMA monomer and 16.253 gram of trifluoroethyl methacrylate (TFEMA) monomer were dissolved in 45 g of PGMEA. The monomer solution was degassed by bubbling with nitrogen for 20 min. PGMEA (23.675 g) was charged into a 500 mL three-neck flask equipped with a condenser and a mechanical stirrer and was degassed by bubbling with nitrogen for 20 min. The solvent in the reaction flask was next brought to a temperature of 80° C. V601 (2.004 g) was dissolved in 6 g of PGMEA and the initiator solution was degassed by bubbling with nitrogen for 20 min. The initiator solution was added to the reaction flask and then monomer solution was fed into the reactor dropwise over a 3 hour period under rigorous stirring and nitrogen environment. After monomer feeding was complete, the polymerization mixture was left standing for one additional hour at 80° C. After 4 hours of polymerization time (3 hours feeding and 1 hour post-feeding stirring), the polymerization mixture was allowed to cool to room temperature. Precipitation was carried out in a methanol/water (8/2) mixture (1280 g). The precipitated polymer was collected by filtration, air-dried overnight, re-dissolved in 90 g of THF, and re-precipitated into a methanol/water (8/2) mixture (1280 g). The final polymer was filtered, air-dried overnight and further dried under vacuum at 25° C. for 48 hours to give 25.5 g of poly(nBMA/TFEMA) (50/50) copolymer (OP-6) (Mw=9,830 and Mw/Mn=1.66).

Synthesis of Poly(TFEMA) (OP-7)

30 gram of TFEMA monomer was dissolved in 45 g of PGMEA. The monomer solution was degassed by bubbling with nitrogen for 20 min. PGMEA (23.314 g) was charged into a 500 mL three-neck flask equipped with a condenser and a mechanical stirrer and was degassed by bubbling with nitrogen for 20 min. The solvent in the reaction flask was next brought to a temperature of 80° C. V601 (1.849 g) was dissolved in 6 g of PGMEA and the initiator solution was degassed by bubbling with nitrogen for 20 min. The initiator solution was added to the reaction flask and then monomer solution was fed into the reactor dropwise over a 3 hour period under rigorous stirring and nitrogen environment. After monomer feeding was complete, the polymerization mixture was left standing for one additional hour at 80° C. After 4 hours of polymerization time (3 hours feeding and 1 hour post-feeding stirring), the polymerization mixture was allowed to cool to room temperature. Precipitation was carried out in a methanol/water (8/2) mixture (1274 g). The precipitated polymer was collected by filtration, air-dried overnight, re-dissolved in 90 g of THF, and re-precipitated into methanol/water (8/2) mixture (1274 g). The final polymer was filtered, air-dried overnight and further dried under vacuum at 25° C. for 48 hrs to give 22.6 g of poly(TFEMA) polymer (OP-7) (Mw=9,895 and Mw/Mn=1.59).

Synthesis of Overcoat Polymers (OP-8-OP-19)

Additional overcoat polymers were synthesized using similar procedures as described above for overcoat polymers OP-1-OP-7 using the components and amounts specified in Table 1. Weight average molecular weight (Mw) and polydispersity index (Mw/Mn) for the polymers were determined and are set forth in Table 1.

TABLE 1

| Polymer | Monomer(s) | Composition* | Initiator** | Mw | Mw/Mn |
|---|---|---|---|---|---|
| OP-1 | iBMA | 100 | 5.0% | 8,641 | 1.61 |
| OP-2 | iBMA/nBMA | 75/25 | 5.0% | 9,203 | 1.60 |
| OP-3 | iBMA/nBMA | 50/50 | 5.0% | 8,812 | 1.60 |
| OP-4 | iBMA/nBMA | 25/75 | 5.0% | 9,654 | 1.60 |
| OP-5 | nBMA | 100 | 5.0% | 9,194 | 1.60 |
| OP-6 | nBMA/TFEMA | 50/50 | 4.5% | 9,830 | 1.66 |
| OP-7 | TFEMA | 100 | 4.5% | 9,895 | 1.59 |
| OP-8 | nBMA | 100 | 10.0% | 5,625 | 1.38 |
| OP-9 | nBMA | 100 | 2.0% | 17,647 | 1.88 |
| OP-10 | nBMA | 100 | 1.5% | 23,997 | 1.98 |
| OP-11 | iBMA | 100 | 10.0% | 5,499 | 1.37 |
| OP-12 | iBMA | 100 | 7.0% | 6,867 | 1.55 |
| OP-13 | iBMA | 100 | 2.0% | 18,913 | 1.85 |
| OP-14 | iBMA | 100 | 1.5% | 24,087 | 2.02 |
| OP-15 | iBMA/nBMA | 50/50 | 10.0% | 5,430 | 1.42 |
| OP-16 | iBMA/nBMA | 50/50 | 2.0% | 18,455 | 1.90 |
| OP-17 | iBMA/nBMA | 50/50 | 1.5% | 22,702 | 2.04 |
| OP-18 | iBMA/nBMA/TFEMA | 60/20/20 | 4.5% | 9,542 | 1.67 |
| OP-19 | nBMA/TFEMA | 75/25 | 4.5% | 9,073 | 1.60 |

*Molar feed ratio in the polymerization
**Mole percent with respect to monomer

Photoresist Composition Preparation
Photoresist Composition 1 (PC-1)

1.294 g of PP-1 and 1.294 g of PP-2 were dissolved in 29.633 g of PGMEA, 19.380 g of cyclohexanone, and 48.450 g of methyl-2-hydroxyisobutyrate. To this mixture was added 0.484 g of "PAG A" described below and 0.029 g of 1-(tert-butoxycarbonyl)-4-hydroxypiperidine. The resulting mixture was rolled on a mechanical roller for three hours and then filtered through a Teflon filter having a 0.2 micron pore size.

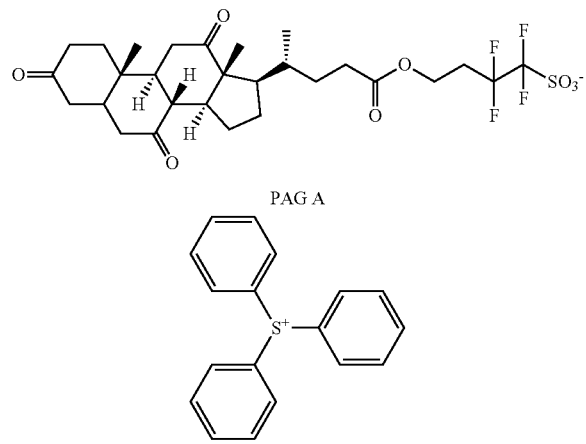

PAG A

Photoresist Composition 2 (PC-2)

1.263 g of PP-1 and 1.263 g of PP-2 were dissolved in 29.620 g of PGMEA, 19.385 g of cyclohexanone, and 48.455 g of methyl-2-hydroxyisobutyrate. To this mixture was added 0.484 g of PAG A, 0.029 g of 1-(tert-butoxycarbonyl)-4-hydroxypiperidine and 0.062 g of OP-10. The resulting mixture was rolled on a mechanical roller for three hours and then filtered through a Teflon filter having a 0.2 micron pore size.

Photoresist Composition 3 (PC-3)

5.061 g of PP-1 was dissolved in 28.140 g of PGMEA, 18.760 g of cyclohexanone, and 46.900 g of methyl-2-hydroxyisobutyrate. To this mixture was added 0.992 g of PAG A, 0.023 g of 1-(tert-butoxycarbonyl)-4-hydroxypiperidine and 0.124 g of OP-10. The resulting mixture was rolled on a mechanical roller for three hours and then filtered through a Teflon filter having a 0.2 micron pore size.

Characterization of Overcoat Polymers

A solid solution for each of overcoat polymers OP-1 to OP-19 was made by dissolving the polymer in PGMEA to form a 10 wt % solid solution. The solutions were filtered through a Teflon filter having a 0.2 micron pore size. The filtered solutions were coated on 200 mm bare silicon wafers, and the coated wafers were soft-baked at 120° C. for 60 seconds to give a film thickness of about 4000 Å. Two sets of wafers for each polymer were prepared for dissolution rate and contact angle measurements. The dissolution rates of overcoat polymers were measured on a dissolution rate monitor (RDA-800EUV from Litho Tech Japan) using 2-heptanone as a developer. Maximum dissolution rates of overcoat polymers were calculated as an average of 18 dissolution rates acquired through 18 different channels.

In order to measure optical properties of overcoat polymers, overcoat polymer solutions (10% solids by weight in PGMEA) were coated at 1100 rpm onto 200 mm bare silicon wafers and soft-baked at 120° C. for 60 seconds on a TEL CleanTrack ACT 8 coater/developer to provide a film thickness of ~4000 Å. Optical properties of the coated films were measure on a VUV-VASE VU-302 ellipsometer (J.A. Woollam Co.). Polarization data was collected at three angles over a wide range of wavelengths. The generated data was analyzed and fit against a model to obtain n and k values at 193 nm.

Characterization results with overcoat polymers including dissolution rates in 2-heptanone, water contact angles and optical properties (n and k) at 193 nm are summarized in Table 2.

TABLE 2

| Polymer | Dissolution rate, nm/sec | Contact angles | | | | n | k |
|---|---|---|---|---|---|---|---|
| | | Static | Receding | Advancing | Tilting | | |
| OP-1 | 1380 | 89.2 | 77.4 | 88.9 | 13.5 | 1.637 | 0.002034 |
| OP-2 | 2630 | 89.0 | 76.3 | 88.7 | 14.8 | 1.649 | 0.001652 |
| OP-3 | 5080 | 88.5 | 75.7 | 89.0 | 14.8 | 1.642 | 0.001958 |
| OP-4 | 5750 | 87.9 | 73.4 | 90.5 | 18.2 | 1.640 | 0.002218 |
| OP-5 | 6070 | 87.2 | 70.5 | 97.0 | 29.0 | 1.646 | 0.001488 |
| OP-6 | 2700 | 95.4 | 79.6 | 96.7 | 17.7 | N/A | N/A |
| OP-7 | N/A | 96.0 | 84.6 | 963 | 13.3 | N/A | N/A |
| OP-11 | 2180 | 87.5 | 76.2 | 90.7 | 14.9 | N/A | N/A |
| OP-12 | 1840 | 87.6 | 76.8 | 92.6 | 14.8 | N/A | N/A |
| OP-13 | 600 | 88.4 | 76.9 | 92.6 | 13.6 | N/A | N/A |
| OP-14 | 630 | 89.0 | 78.6 | 90.0 | 13.0 | 1.641 | 0.001049 |
| OP-18 | 1700 | 93.1 | 79.3 | 95.4 | 16.6 | 1.620 | 0.001428 |
| OP-19 | 5500 | 93.2 | 76.5 | 92.8 | 19.3 | N/A | N/A |

N/A = Not measured

Resist Overcoat Composition Preparation

Resist overcoat compositions were prepared by dissolving an overcoat polymer and basic quencher (if present) in a solvent using the components and amounts set forth in Table 3. The resulting mixtures were rolled on a mechanical roller for three hours and then filtered through a Teflon filter having a 0.2 micron pore size. The compositions were formulated based on target thicknesses (after spin coating at 1500 rpm) corresponding to one quarter the wavelength of the incoming wave to reduce reflectance at the overcoat surface.

TABLE 3

| Overcoat composition | Polymer | Quencher | Solvent | Target thickness, Å |
|---|---|---|---|---|
| OC-1 (Comp) | OP-2 (1.560 g) | — | NBB (98.440 g) | 290 |
| OC-2 (Comp) | OP-2 (4.450 g) | — | NBB (95.550 g) | 880 |
| OC-3 (Comp) | OP-2 (1.560 g) | — | IBIB (98.440 g) | 290 |
| OC-4 (Comp) | OP-2 (4.450 g) | — | IBIB (95.550 g) | 880 |
| OC-5 | OP-2 (1.552 g) | TBOC-4HP (0.008 g) | IBIB (98.440 g) | 290 |
| OC-6 | OP-2 (4.428 g) | TBOC-4HP (0.022 g) | IBIB (95.550 g) | 880 |
| OC-7 | OP-2 (3.413 g) | TBOC-4HP (0.017 g) | IBIB (96.570 g) | 880 |
| OC-8 | OP-2 (3.396 g) | TBOC-4HP (0.034 g) | IBIB (96.570 g) | 880 |
| OC-9 | OP-2 (3.361 g) | TBOC-4HP (0.069 g) | IBIB (96.570 g) | 880 |
| OC-10 | OP-2 (3.396 g) | TBPC (0.034 g) | IBIB (96.570 g) | 880 |
| OC-11 | OP-2 (3.396 g) | TIPA (0.034 g) | IBIB (96.570 g) | 880 |

TBOC-4HP = 1-(tert-butoxycarbonyl)-4-hydroxypiperidine, TBPC = tert-butyl 1-pyrrolidinecarboxylate, TIPA = triisopropanolamine Immersion Lithographic Process 300 mm silicon wafers were spin-coated with AR™40A antireflectant (Rohm and Haas Electronic Materials) to form a first BARC layer on a TEL CLEAN TRAC LITHIUS i+ coater/developer. The wafers were baked for 60 seconds at 215° C., yielding a first BARC film with a thickness of 840 Å. A second BARC layer was next coated over the first BARC using AR™124 antireflectant (Rohm and Haas Electronic Materials), and was baked at 205° C. for 60 seconds to generate a 200 Å top BARC layer. Photoresist compositions were then coated on the dual BARC-coated wafers and soft-baked at 90° C. for 60 seconds on a TEL CLEAN TRACK LITHIUS i+ coater/developer to provide a resist layer with a thickness of ~900 Å. Overcoat compositions were coated on top of the resist and soft-baked at 90° C. for 60 seconds on a TEL CLEAN TRACK LITHIUS i+ coater/developer to provide an overcoat thickness of 290 or 880 Å.

Negative Tone Development Process

Wafers were exposed through a mask on an ASML TWIN-SCAN XT:1900i immersion scanner using a crossed sectoral quadruple (C-Quad) illumination with 1.35 NA, 0.9 outer sigma, 0.7 inner sigma and XY polarization. The exposed wafers were post-exposure baked at 90° C. for 60 seconds and then developed using a 1:1 (by weight) mixture of 2-heptanone and n-butyl propionate for 25 seconds on a TEL CLEAN TRACK™ LITHIUS™ i+ coater/developer to give negative tone patterns. Optimum energy ($E_{op}$) to print 45 nm holes was determined for the single exposure NTD process by plotting CD values, measured on a Hitachi CG4000 CD SEM, as a function of exposure energy using a mask CD at 60 nm (the diameter of an opaque post on the mask) and a pitch CD at 90 nm (a mask CD plus the distance between opaque posts). EL was measured as described above for 45 nm contact holes. Local CD uniformity of 45 nm holes was measured as a 3σ of 240 CD values. For each wafer, 20 images were taken per die and 12 contact hole measurements per image were taken at 250K magnification. Focus offset was changed in an increment of 50 nm to examine depth of focus (DOF) for different examples and DOF was determined by the hole fidelity from SEM images taken through the focus change. The results are shown in Table 4.

Improved exposure latitude resulted for Examples 10-13 in which an overcoat layer was used in the lithographic process as compared with Example 9 which did not include an overcoat layer. DOF was significantly improved for Examples 12 and 13 employing an overcoat composition containing a basic quencher in accordance with the invention as compared with Comparative Example 9, free of an overcoat layer, and Examples 10-11 which include an overcoat composition with no basic quencher. The improved DOF was observed in the patterns in the form of more contact holes being opened in the defocus areas.

Dry Lithographic Process

Dry lithography was performed to examine the effect of different basic quenchers on 200 mm silicon wafers using a TEL CleanTrack ACT 8 linked to an ASML/1100 scanner. Silicon wafers were spin-coated with AR™77 bottom-antireflective coating (BARC) material (Rohm and Haas Electronic Materials) and baked for 60 seconds at 205° C. to yield a film thickness of 840 Å. Photoresist composition PC-3 was coated on the BARC-coated wafers and soft-baked at 90° C. for 60 seconds on a TEL CleanTrack ACT 8 coater/developer to provide a resist layer thickness of 1800 Å. Overcoat compositions as set forth in Table 5 were coated on top of the resist and soft-baked at 90° C. for 60 seconds on a TEL CleanTrack ACT 8 coater/developer to provide an overcoat thickness of 880 Å. The wafers were exposed using an annular illumination condition with 0.75 NA, 0.89 outer sigma and 0.64 inner sigma. The exposed wafers were post-exposure baked at 85° C. for 60 seconds and developed with 50:50 2-heptanone and n-butyl propionate developer for 25 seconds on a TEL CleanTrack ACT 8 coater/developer. CD was targeted at 100 nm trenches at 1500 nm pitch using a mask CD of 100 nm Contact angle, Eop and EL results are set forth in Table 5. As can be seen from this data, similar contact angle data was obtained for different quencher loading and different quenchers having different polarities. Improved EL was observed with the use of an overcoat.

TABLE 4

| Example | Photoresist Composition | Overcoat Composition | Overcoat Thickness, Å | Eop, mJ/cm$^2$ | EL, nm/(mJ/cm$^2$) | 3σ CDU, nm | DOF, nm |
|---|---|---|---|---|---|---|---|
| 9 (Comp.) | PC-2 | N/A | N/A | 44.1 | 1.41 | 3.89 | 100 |
| 10 (Comp.) | PC-1 | OC-3 | 290 | 44.9 | 1.16 | 3.54 | 100 |
| 11 (Comp.) | PC-1 | OC-4 | 880 | 46.1 | 1.16 | 3.84 | 100 |
| 12 | PC-1 | OC-5 | 290 | 42.5 | 1.28 | 3.56 | 150 |
| 13 | PC-1 | OC-6 | 880 | 45.9 | 1.06 | 3.82 | 150 |

TABLE 5

| Example | Photoresist Composition | Overcoat Composition | Contact angles | | | | Eop, mJ/cm2 | EL, nm/(mJ/cm2) |
|---|---|---|---|---|---|---|---|---|
| | | | Static | Receding | Advancing | Tilting | | |
| 14 (Comp.) | PC-3 | — | 86.1 | 71.8 | 90.3 | 17.7 | 18.1 | 9.0 |
| 15 | PC-3 | OC-7 | 87.2 | 75.3 | 91.2 | 15.7 | 19.1 | 7.4 |
| 16 | PC-3 | OC-8 | 87.3 | 75.7 | 92.2 | 15.8 | 19.7 | 7.3 |
| 17 | PC-3 | OC-9 | 87.3 | 75.5 | 92.6 | 16.1 | 19.3 | 7.6 |
| 18 | PC-3 | OC-10 | 87.1 | 75.2 | 91.7 | 16 | 19.6 | 8.2 |
| 19 | PC-3 | OC-11 | 87.0 | 76.4 | 90.7 | 15.9 | 19.2 | 8.1 |

What is claimed is:

1. A method of forming an electronic device, comprising:
   (a) providing a semiconductor substrate comprising one or more layers to be patterned;
   (b) forming a photoresist layer over the one or more layers to be patterned;
   (c) coating a photoresist overcoat composition over the photoresist layer, wherein the overcoat composition comprises a basic quencher, a polymer and an organic solvent, wherein the basic quencher forms a graded or segregated layer at the interface between the photoresist layer and photoresist overcoat composition;
   (d) exposing the layer to actinic radiation; and
   (e) developing the exposed film with an organic solvent developer.

2. The method of claim 1, wherein the organic solvent developer comprises 2-heptanone.

3. The method of claim 1, wherein the organic solvent developer comprises n-butyl acetate.

4. The method of claim 1, wherein the organic solvent developer comprises n-butyl propionate.

5. The method of claim 1, wherein the organic solvent of the photoresist overcoat composition comprises an alkyl butyrate.

6. The method of claim 5, wherein the organic solvent of the photoresist overcoat composition comprises a $C_8$-$C_9$ alkyl butyrate.

7. The method of claim 1, wherein the organic solvent of the photoresist overcoat composition comprises an alkyl propionate.

8. The method of claim 7, wherein the organic solvent of the photoresist overcoat composition comprises a $C_8$-$C_9$ alkyl propionate.

9. The method of claim 1, wherein the organic solvent of the photoresist overcoat composition comprises a ketone.

10. The method of claim 9, wherein the solvent comprises a $C_8$-$C_9$ branched ketone.

11. A method of forming an electronic device, comprising:
    (a) providing a semiconductor substrate comprising one or more layers to be patterned;
    (b) forming a photoresist layer over the one or more layers to be patterned;
    (c) coating a photoresist overcoat composition over the photoresist layer, wherein the overcoat composition comprises a basic quencher, a polymer and an organic solvent, wherein the basic quencher has a high surface free energy relative to other components of the overcoat composition;
    (d) exposing the layer to actinic radiation; and
    (e) developing the exposed film with an organic solvent developer.

* * * * *